United States Patent [19]

Nishioka et al.

[11] 3,952,277

[45] Apr. 20, 1976

[54] COMBINED VARIABLE RESISTOR ASSEMBLY PROVIDED WITH POSITION INDICATOR MEANS

[75] Inventors: Matsuo Nishioka; Shunzo Oka, both of Hirakata; Akitoshi Miyashita, Suita; Kazuo Oshima, Osaka, all of Japan

[73] Assignee: Matsushita Electric Industrial Co., Ltd., Osaka, Japan

[22] Filed: Feb. 12, 1975

[21] Appl. No.: 549,148

Related U.S. Application Data

[62] Division of Ser. No. 427,735, Dec. 26, 1973.

[30] Foreign Application Priority Data

Dec. 28, 1972  Japan............................ 48-4577[U]
Dec. 28, 1972  Japan............................ 48-4578[U]
Dec. 28, 1972  Japan............................ 48-4579[U]
Dec. 28, 1972  Japan............................ 48-4580[U]

[52] U.S. Cl............................. 338/119; 116/124.4; 240/1 EL; 338/128; 338/196; 340/380
[51] Int. Cl.²............................................ H01C 10/30
[58] Field of Search.................. 338/119, 128–134, 338/185, 196, 197; 214/1 EL; 340/380, 381; 116/115, 116, 114 M, 124 R, 124 A, 124.1, 124.2, 124.4, 129 L, 129 M

[56] References Cited
UNITED STATES PATENTS

| 2,198,443 | 4/1940 | Paul et al. ...................... 116/129 L |
| 2,437,355 | 3/1948 | Greenslade .................... 338/196 X |
| 3,118,422 | 1/1964 | McNamara ...................... 240/1 EL |
| 3,588,750 | 6/1971 | Takimoto........................ 338/119 X |
| 3,593,152 | 7/1971 | Aoki................................. 116/116 |
| 3,624,582 | 11/1971 | Iwasaki........................... 338/196 X |
| 3,641,471 | 2/1972 | Labudee et al. ................. 338/128 |
| 3,697,986 | 3/1972 | Lace et al. ..................... 340/380 X |

Primary Examiner—Volodymyr Y. Mayewsky
Attorney, Agent, or Firm—Stevens, Davis, Miller & Mosher

[57] ABSTRACT

There is provided a combined variable resistor assembly provided with position indicator means for indicating positions of individual variable resistors by respective bright spots adapted to be moved by manipulating the associated variable resistors. This variable resistor assembly may find use mainly for electronic tuners, and with which the present states of the individual variable resistors for volume control, balance control, sound quality control and so forth can be known at a glance at the indicator means.

4 Claims, 11 Drawing Figures

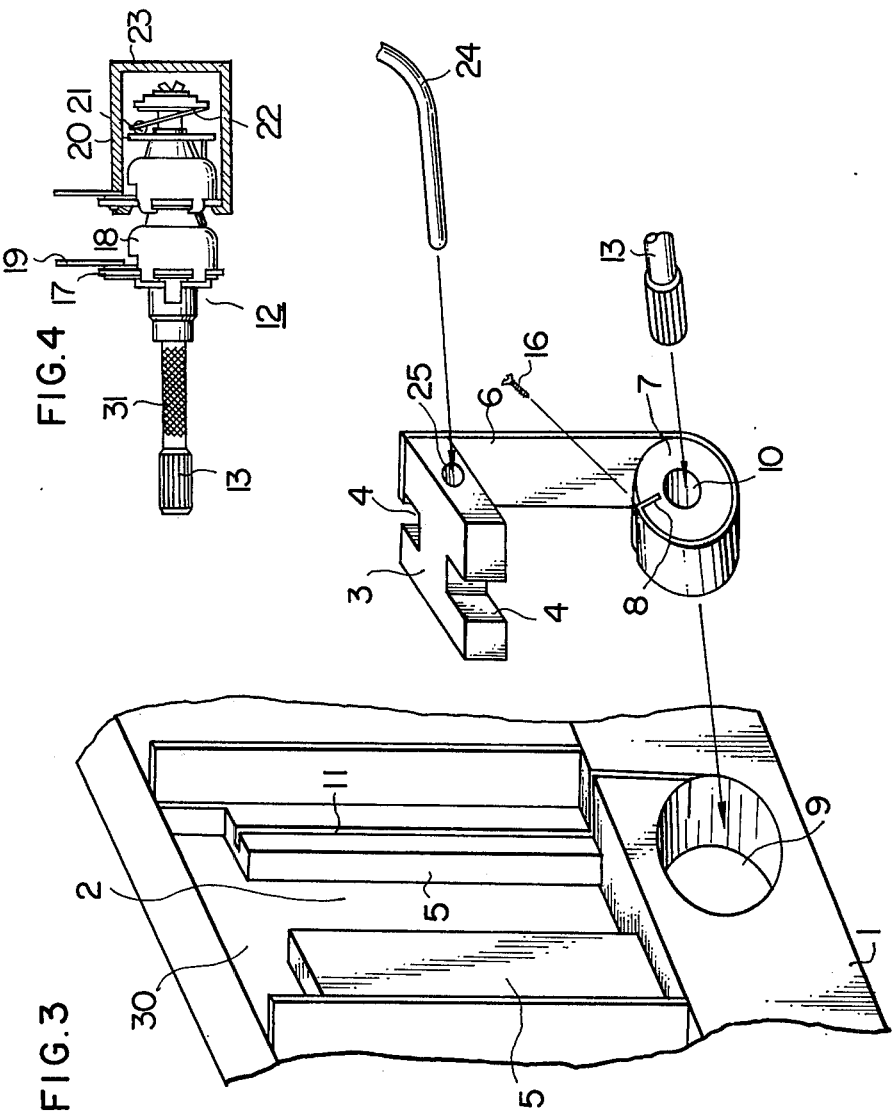

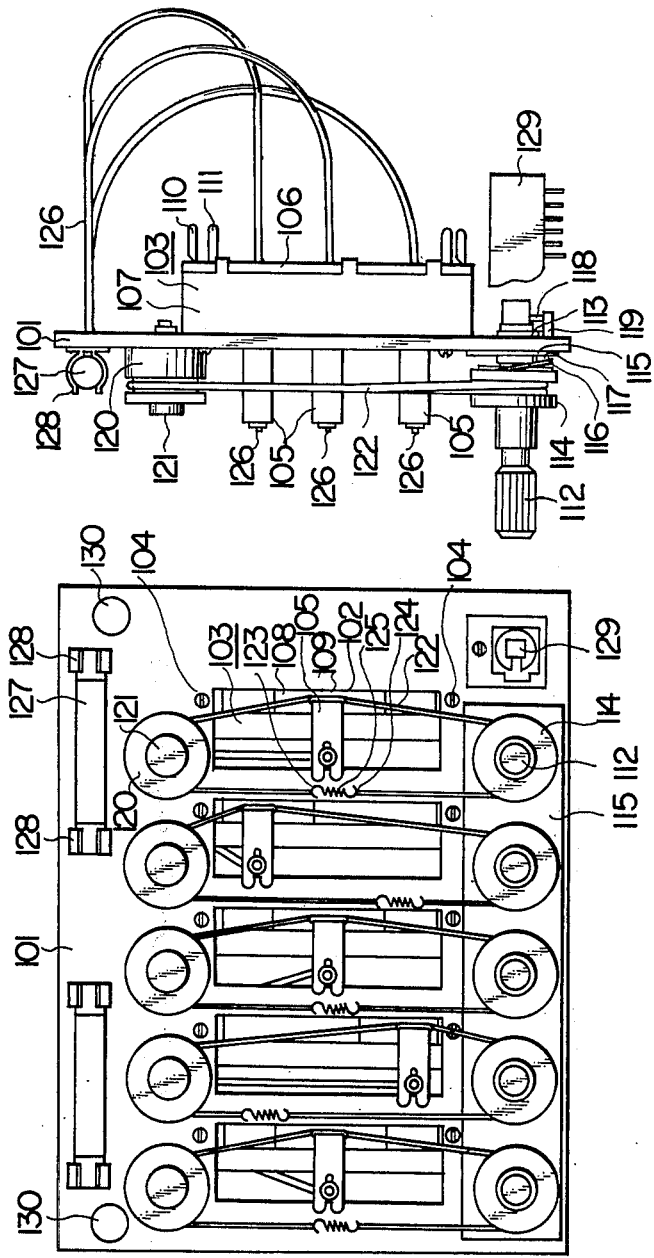

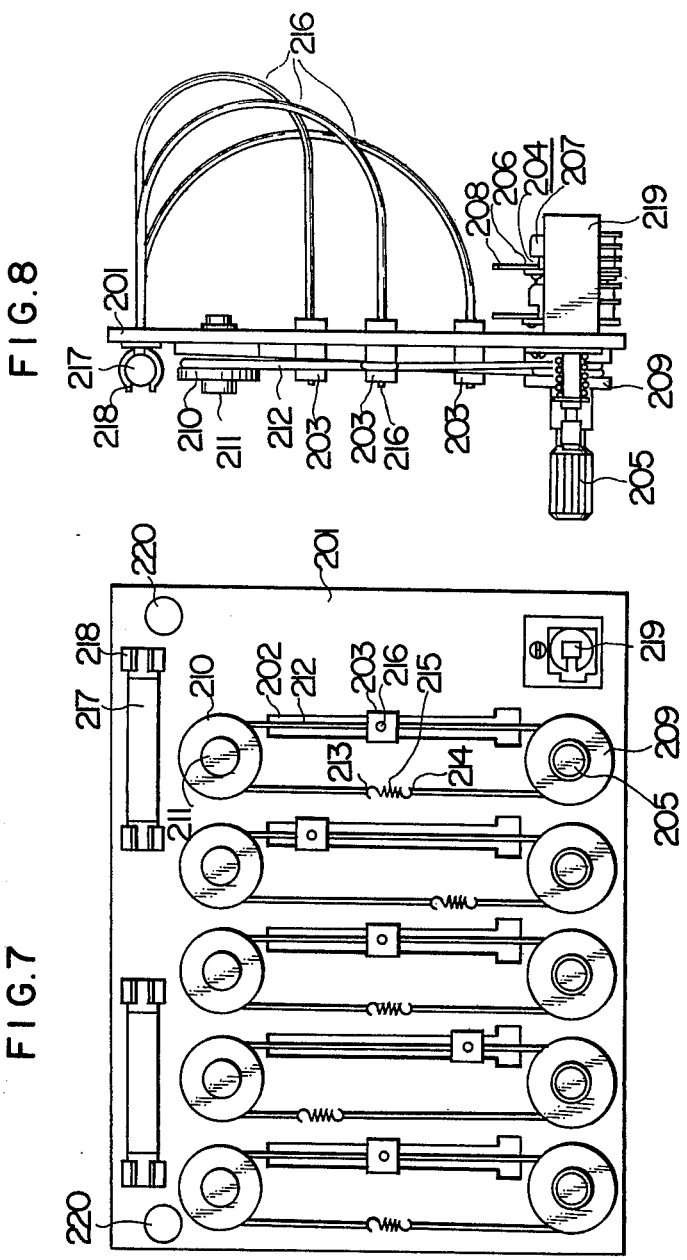

COMBINED VARIABLE RESISTOR ASSEMBLY PROVIDED WITH POSITION INDICATOR MEANS

This is a division of application Ser. No. 427,735 filed Dec. 26, 1973.

This invention relates to a combined variable resistor assembly provided with position indicator means for indicating positions of individual variable resistors by respective bright spots which are moved when the variable resistors are manipulated.

An object of the present invention is to provide a combined variable resistor assembly provided with position indicator means, in which the positions of individual variable resistors for volume control, balance control, sound quality control and various other purposes are represented by the positions of respective bright spots which are displaced in accordance with the movement of the contacts of the corresponding variable resistors, whereby the present states of the individual variable resistors can be known by a glance at the indicator means.

According to the present invention, the position indicating bright spots are moved according to the variable resistance of the corresponding variable resistors, so that the present states of various controls such as the volume control, balance control and sound quality control can be known at a glance, and thus it is possible to increase the commercial value of the combined variable resistor assembly as a set. Also, the assembly is simple in construction and can be inexpensively provided. Thus, the present invention can offer great practical benefits.

The aforesaid and other objects, features and advantages of the present invention, will be apparent from the following description taken in conjunction with the accompanying drawings, in which:

FIG. 3 is a fragmentary perspective view, to an enlarged scale, showing the same in an exploded state and viewed from the back side thereof;

FIG. 4 is a side view showing a rotatable variable resistor employed for the same embodiment;

FIG. 5 is a front view of another embodiment of the present invention;

FIG. 6 is a side view of the same;

FIG. 7 is a front view of a further embodiment of the present invention;

FIG. 8 is a side view of the same;

An embodiment of the present invention will now be described with reference to FIGS. 1 to 4.

Figure 2:
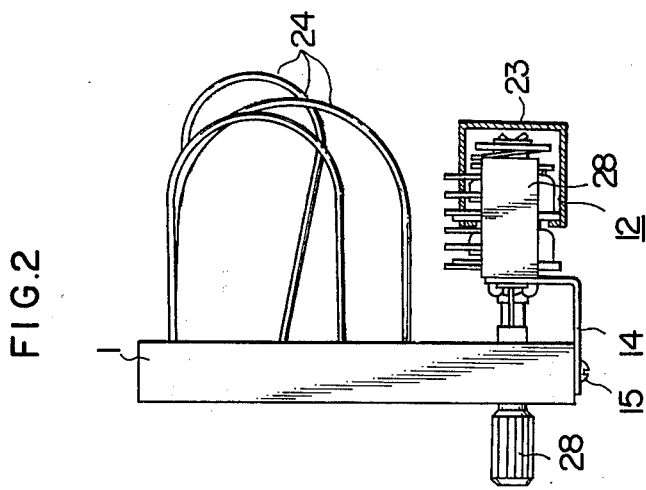
FIG. 2 is a side view of the same embodiment.
Figure 1:
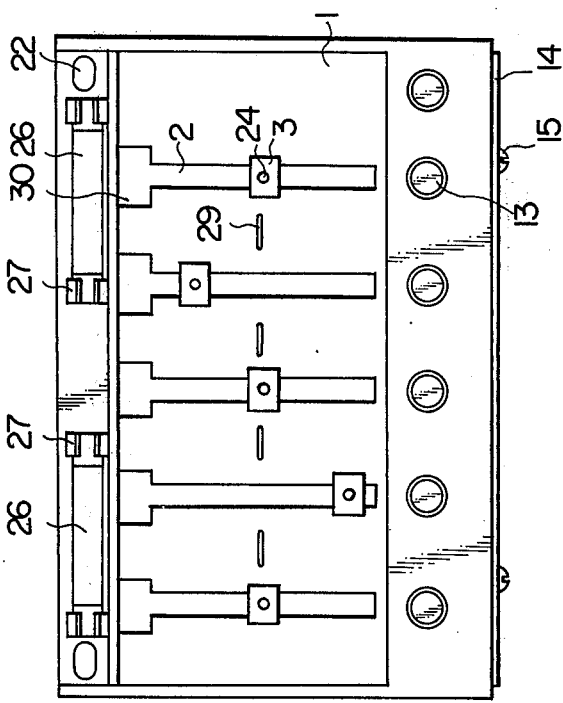
FIG. 1 is a front view of an embodiment of the combined variable resistor assembly provided with position indicator means according to the present invention.

Referring to these Figures, and particularly to FIGS. 1 to 3, there is shown a panel casing 1 having a front wall and side walls. The front wall is formed with a plurality of vertically extending parallel slots 2. An H-shaped slide member 3 is slidably received in each slot 2, with its opposite side recesses 4 engaged with the wall portions 5 adjacent the opposite edges of the slot 2 so that it is movable along the wall portions 5 as the guide. Numeral 6 (FIG. 3) designates a belt, which is secured at its one end to one edge portion of the associated slide member 3, and whose other end is securedly fitted in a groove formed in a cylindrical drum 7 so that it can be taken up on the periphery of the drum 7. The drum 7 is accommodated in a hole or cavity 9 formed in the front wall of the casing 1 at a position below the lower end of the associated slot 2, and it is formed with a central see-through bore 10. The front wall of the casing 1 is also formed on its back side with a plurality of narrow grooves 11 each extending along the associated slot 2 and terminating in the associated cavity 9, the groove slidably receiving and guiding the corresponding edge portion of the associated belt 6 so as to prevent the buckling of the belt 6 and ensure smooth transmission of the rotation of the drum 7 to the associated slide member 3.

Extending through the bore 10 of each drum 7 is a rotatable shaft 13 of a rotatable variable resistor 12. Each rotatable variable resistor 12 is supported on the back side of the panel casing 1 by means of a bracket 14 secured by bolts 15 to the casing. Each drum 7 is secured by a clamp screw 16 to the shaft 13 penetrating the bore 10 so that it rotates in unison with the shaft 13.

Each rotatable variable resistor 12 has a well-known construction, as typically shown in FIG. 4, comprising a support plate 17 carrying the resistor proper and contact means (both resistor and contact means being not shown), a metal cover 18 tied at an open end thereof to the support plate, a brush holder (not shown) interposed between the support plate 17 and metal cover 18 and carrying brush means (not shown) electrically connected to the afore-mentioned resistor and contact means, the aforesaid shaft 13 which is integral with or rotatable in unison with the brush holder, and end terminals 19 and an intermediate terminal (not shown), these terminals being electrically connected to the resistor and contact means respectively and extending straight and in the same direction from the support plate 17.

Each rotatable variable resistor 12 is provided with a click detent mechanism. More particularly, the brush holder, which is rotatable in unison with the shaft 13, is provided with a resilient member constituting a spring arm 22 and having a ball or round head 21 at the free end, the ball or round head being adapted to be clicked into successive holes formed in a click plate 20. The click detent mechanism is covered by a dust-proof case 23.

Numeral 24 (FIGS. 2 and 3) designates optical fibers each having one end portion received in and held in position in a hole formed in the associated slide member 3. The other end of the optical fibers 24 is held in position in the neiborhood of a light source 26 (FIG. 1) mounted in the top portion of the front wall of the casing 1. In this example, two light sources 26 are mounted via respective holders 27 in the casing 1, and the other end of each optical fiber 24 is supported in the neiborhood of either one of these light sources. Each optical fiber 24 has a sufficient length to be able to follow the movement of the associated slide member 3.

Numeral 28 designates a push lock switch mounted on the bracket 14 secured to the casing 1. It may be operated to open or close the circuit of the light sources 26 or other circuits. Numeral 29 designates graduation marks provided on the front wall of the casing 1 and located in the vicinity of the respective slots 2. A click point of the afore-mentioned click action is adjusted to coincide with the graduation marks 29 when securing each drum 7 to the associated shaft 13 by the clamp screw 16. Numeral 30 designates notches formed in a top portion of the front wall of the casing 1 and terminating in the respective slots 2. They are required for fitting the slide members 3 in engagement with the respective slots 2 formed in the casing 1. The shaft 13 has a knurled portion 31 which is fitted in the drum 7. The knurling is provided to prevent the lost rotation of the shaft 13 after the fastening of the clamp screw 16.

In operation, by rotating the shaft 13 of any rotatable variable resistor 12, the associated brush holder is also rotated in unison, causing the sliding movement of the brush means secured to the brush holder over the resistor. Since the contact means is always in contact with part of the brush means, it is thus possible to take out a variable resistance between either one of the end terminals and the intermediate terminal.

Meanwhile, with the rotation of the shaft 13 the associated drum 7 is also rotated in unison, and this rotation is transmitted through the belt 6 to the slide member 3. In other words, the rotational motion of the shaft 13 is converted through the drum and belt 6 into a corresponding translational motion of the slide member 3, that is, the slide member 3 is moved in accordance with the rotation of the shaft 13. The movement of the slide member 3 means the movement of the free end of the associated optical fiber 24. Since the other end of the optical fiber 24 is held in the neiborhood of the light source 26, in the "on" state of the light source 26 the movement of the free end of the optical fiber is observed as the movement of a bright spot. Since the movement of the bright spot and change of the resistance of the variable resistor 12 are simultaneously caused by turning the shaft 13, the resistance taken out can be represented by the corresponding position of the bright spot.

Also, with the rotation of the shaft 13, the spring arm 22 is rotated in unison, causing the ball or round head to successively fall into the click holes in the click plate 20, so that successive click detent actions can be obtained. Here, it is also possible to adjust a mid point between two adjacent click points of the click action to coincide with the graduation mark.

FIGS. 5 and 6 show another embodiment of the invention. In the Figures, numeral 101 designates a panel made of a metal plate and formed with a plurality of vertically elongate parallel openings or windows 102. Numeral 103 designates slidable vertical resistors corresponding in number to the number of the elongate openings 102. They extend parallel and are secured by means of screws 104 to the back side of the panel 101, each of them having a slide lever 105 penetrating the associated elongate opening 102.

Each of the slidable variable resistors 103 has a well-known construction, comprising a support plate 106 carrying the resistor proper and contact means (both resistor and contact means being not shown), a metal cover 107 tied at an opening thereof to the support plate 106, a slide member 108 extending between the support plate 106 and metal cover 107 and carrying brush means (not shown) slidable over the resistor and contact means, the aforesaid slide lever 105 secured to the slide member 108 and extending through a guide slot 109 formed in the metal cover 107, and terminals 110 and 111 electrically connected to the resistor and contact means respectively and taken out of the support plate 106.

Rotatable shafts 112 corresponding in number to the number of the slidable variable resistors 103 are journaled in respective bearings 113 mounted in the panel 101 below the slidable range of the respectively associated slide levers 105. Each shaft 112 is provided with a lower pulley 114 secured to its portion extending on the front side of the panel 101. Numeral 115 designates an elongate click plate secured, by corking the shafts for instance, to a lower portion of the panel 101 on the front side thereof. Each lower pulley 114 is provided on its side facing the click plate 115 with a resilient member 116 constituting a spring arm and having a ball or round head 117 at the free end, the ball or round head 117 being adapted to be successively clicked to the resiliency of the spring arm 116 into a plurality of click holes (not shown) formed in the click plate 115. Thus, each shaft 112 may be turned with a sense of click detent effect as the ball or round head 117 successively falls into the click holes in accompaniment of the rotation of the spring arm 116 in unison with the shaft 112. Each sahft 112 is provided with two stopper pins 118 extending from its end portion extending on the back side of the panel 101. These stopper pins 118 are adapted to engage with a stopper protrusion 119 protruding from the panel 101, thus limiting the rotational angle or angular span of the shaft 112. Paired with the lower pulleys 114 are upper pulleys 120, which of course correspond in number to the number of the slidable variable resistors 103 and are mount for rotation on respective rivets 121 extending from the front side of the panel 101 above the slidable range of the respectively associated slide levers 105. Each slide lever 105 is tied to a rope 122, which is passed round the associated upper and lower pulleys 120 and 114 in pair and is connected at the opposite ends to a coil spring 125 to form a loop, the coil spring 125 serving to hold the rope 122 under a constant tension. The rope 122 is wound round the lower pulley 114 at least one turn so that the rotation of the shaft 112 may be securely transmitted to the rope 122. The upper pulley 120 serves as an idler. Each slide lever 105 is thus moved with the rotation of the associated shaft 112 through the associated rope 122.

Numeral 126 designates optical fibers each of which has one end secured to an end portion of the associated slide lever 105, penetrates the associated elongate opening 102 formed in the panel 101 and has the other end held in position in the neiborhood of a light source 127. In this example, two light sources 127 are mounted via respective holders 128 in the panel 101, and the other end of each optical fiber 126 is supported in the neiborhood of either one of these light sources. Each optical fiber 126 has a sufficient length to be able to follow the movement of the associated slide lever 105. The optical fibers 126 and slide levers 105 are arranged such that they will not interfere with the movement of the ropes 122.

Numeral 129 designates a push lock switch secured to panel 101. The push lock switch 129 is operated to open and close the circuit of the light sources and the other circuits. Numeral 130 designates attachment holes formed in the panel 101 for assembling it in a set using it.

In operation, by turning any shaft 112, its rotation is transmitted to the associated rope 122 through the pulleys 114 and 120, causing the movement of the rope 122 and hence the movement of the associated slide lever 105. With the movement of the slide lever 105 the integral slide member 108 of the slidable variable resistor 103 is also moved in unison within the space defined between support plate 106 and metal cover 107, causing the sliding movement of the brush means secured to the slide member 108 over the resistor and contact means. In this way, it is possible to take out a variable resistance between either one of air end terminals 110 and the intermediate terminal 111.

Meanwhile, with the movement of the slide lever 105 the free end of the associated optical fiber 126 is also moved in unison. Since the other end of the optical fiber 126 is held in the neiborhood of the light source 127, with the light source 127 in the "on" state the movement of the free end of the optical fiber is observed as the movement of a bright spot. In other words, since the movement of the bright spot and change of the resistance of the variable resistor 103 are simultaneously caused by turning the shaft 112, the resistance taken out can be represented by the corresponding position of the bright spot.

Also, with the rotation of the shaft 112 the spring arm 116 is rotated in unison, causing the ball or round head 117 to successively fall into the click holes formed in the click plate 115, thus providing the sense of the click detent effect.

It may be again worthwhile here to provide the panel 101 with graduation marks for the respective position indicators and adjust a click point of the click action to coincide with each graduation mark.

FIGS. 7 and 8 show a further embodiment of the invention. In the Figures, numeral 201 designates a panel made of a metal plate. It is formed with a plurality of vertically extending parallel slots 202. A slide member 203 is slidably received in each slot 202 of the panel 201. Numeral 204 designates rotatable variable resistors corresponding in number to the number of the slots 202, and each of which is mounted on the back side of a lower portion of the panel 201 with its rotatable shaft 205 extending to the front side of the panel.

Each rotatable variable resistor 204 has a well-known construction, comprising a support plate 206 carrying the resistor proper and contact means (both resistor and contact means being not shown), a metal cover 207 tied at an open end thereof to the support plate 206, a brush holder (not shown) interposed between the support plate 206 and metal cover 207 and carrying brush means (not shown) electrically connected to the aforesaid resistor and contact means, the aforesaid shaft 205 which is integral with or rotatable in unison with the brush holder, and end terminals 208 and an intermediate terminal (not shown), these terminals being electrically connected to the resistor and contact means and extending straight and in the same direction from the support plate 206.

Each of the shafts 205 is provided with a lower pulley 209 secured to its portion extending on the front side of the panel 201. Numeral 210 designates upper pulleys corresponding in number to the number of the rotatable variable resistors and paired with the respective lower pulleys 209. The lower and upper pulleys 209 and 210 in each pair are located below and above the span of the each associated slide member 203. Each upper pulley 210 is mounted for rotation on a rivet 211 extending from the front side of the panel 201. Each slide member 203 is tied to a rope 212, which is passed round the associated upper and lower pulleys 210 and 209 and is connected at its opposite ends 213 and 214 to a coil spring 215 to form a loop, the coil spring 215 serving to hold the rope 212 under a constant tension. The rope 212 is wound round the lower pulley 209 at least one turn so that the rotation of the shaft 205 may be securely transmitted to the rope 212. The upper pulley 210 serves as an idler. Each slide member 203 is thus moved with the rotation of the associated shaft 205 through the associated rope 212.

Numeral 216 designates optical fibers each of which has one end secured to the associated slide member 203 and the other end held in position in the neiborhood of a light source 217. Here, two light sources 217 are mounted via respective holders 218 in the panel 201, and the other end of each optical fiber 216 is supported in the neiborhood of either one of these light sources. Each optical fiber 216 has a sufficient length to be able to follow the movement of the associated slide member 203. The optical fibers 216 and slide members 203 are arranged such that they will not interfere with the movement of the ropes 212.

Numeral 219 designates a push lock switch secured to the panel 201. The push lock switch 219 is operated to open and close the circuit of the light sources 217 and other circuits. Numeral 220 designates attachment holes formed in the panel 201 for assembling it in a set using it.

In operation, by turning any shaft 205, its rotation is transmitted to the associated rope 212 through the pulleys 209 and 210, thus causing the movement of the rope 212 and hence the movement of the associated slide member 203. With the rotation of the shaft 205, the associated brush holder of the rotatable variable resistor 204 is also rotated in unison, causing the sliding movement of the brush means secured to the brush holder over the resistor. Since the contact means is always in contact with part of the brush means, it is thus possible to take out a variable resistance between either one of the end terminals and the intermediate terminal.

Meanwhile, with the movement of the slide member 203 caused through the rope 212 and pulleys 209 and 210 due to the rotation of the shaft 205, the free end of the associated optical fiber 216 is also moved in unison with the slide member 203. Since the other end of the optical fiber 216 is held in the neiborhood of the light source 217, with the light source 217 in the "on" state the movement of the free end of the optical fiber is observed as the movement of the bright spot. Since the movement of the bright spot and change of the resistance of the variable resistor 204 are thus simultaneously caused by turning the shaft 205, the resistance taken out can be represented by the corresponding position of the bright spot.

Again here, it may be worthwhile to provide each rotatable variable resistor 204 with a click detent mechanism and the panel 210 with graduation marks for the respective position indicators and adjust a click point of the click action of each click detent mechanism to coincide with each graduation mark.

Figure 10:
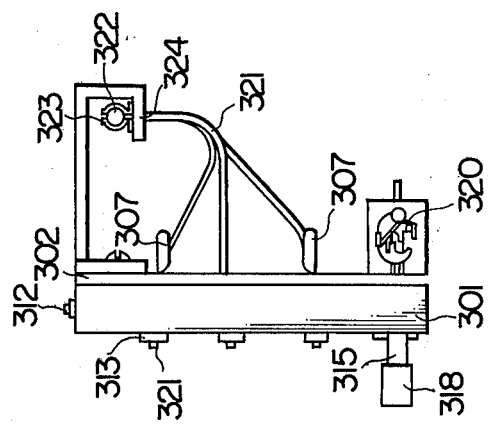
FIG. 10 is a side view of the same.
Figure 9:
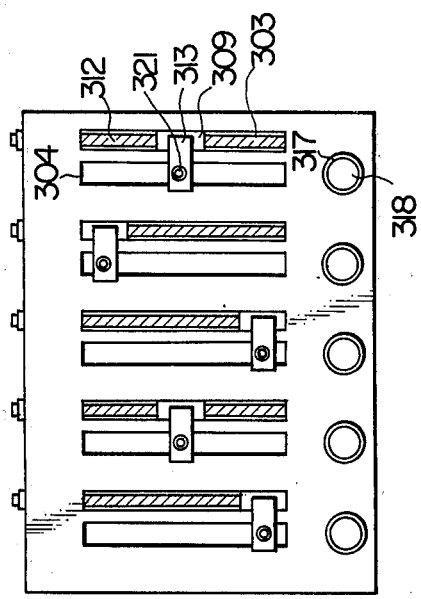
FIG. 9 is a front view of a still further embodiment of the present invention.
Figure 11:
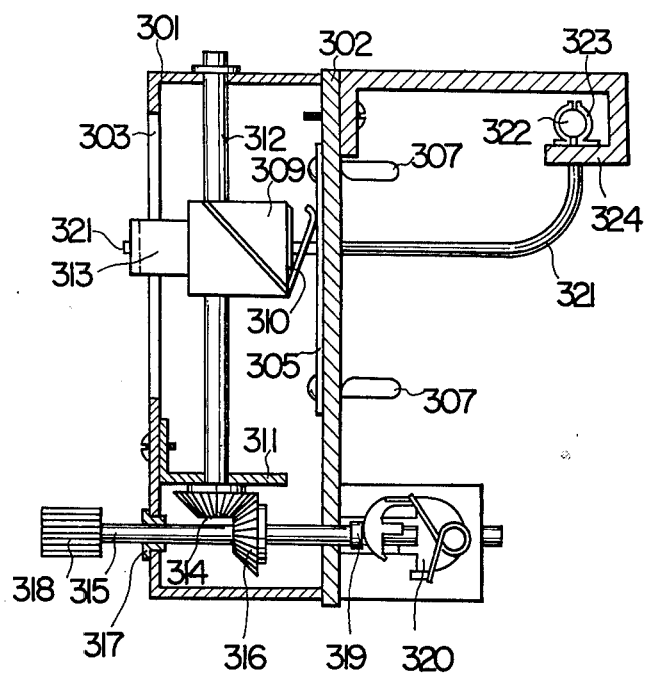
FIG. 11 is a sectional view, to an enlarged scale, showing the same embodiment.

FIGS. 9 to 11 show a still further embodiment of the invention. In the Figures, numeral 301 designates a box-like metal casing, and numeral 302 an insulating plate tied to the casing 301 at a back side opening thereof. The front wall of the casing 301 is formed with a plurality of parallel slots 303 and also the same number of parallel slots 304 paired with the respective slots 303. The insulating plate 302 carries resistors 305

(FIG. 11) corresponding in number to the number of the slots 303 and also contact means 306 (not shown) associated with the respective resistors. The resistors 305 and contact means 306 extend parallel and face the respective associated slots 303, and respectively associated terminals 307 and 308 (terminals 308 being not shown) are taken out of the insulating plate 302.

In slidable contact with each resistor 305 and the associated contact means 306 and providing for electric conduction therebetween is a brush 310, which is secured to the back side of a slide member 309, through which a drive shaft 312 formed with a peripheral helical groove extends rotatably. Each shaft 312 penetrates the top wall of the metal casing 301 and a bracket 311 provided within the casing 301, and the brush 310 carried by it is in mesh with the helical groove. The slide members 309 and drive shafts 312 are disposed to face the respective slots 303. Extending from the front side of each slide member 309 is an arm 313, which penetrates the associated slot 303 to the outside of the metal casing 301. Each arm 313 has a projection projecting on the outer side of the casing 301 and reaching a position in front of the associated slot 304. Each drive shaft 312 has a bevel gear 314 secured to its lower end. In mesh with each bevel gear 314 is a bevel gear 316 secured to a rotatable shaft 315 journaled in a bearing 317 mounted in the front wall of the casing 301. Each rotatable shaft 315 is provided on its end portion extending on the outer side of the casing 301 with a knob 318. The axis of the bevel gear 314 is at right angles to the axis of the associated bevel gear 316, so that the rotation of the shaft 315 is transmitted in a direction normal to its axis. Each shaft 315 penetrates the insulating plate 302 and has a stepped portion 319 of an increased diameter at its end remote from the knob 318. The stepped portion 319 serves as a stopper with respect to the pulling of the shaft 315 and also as a lock means to co-operate with a push lock mechanism 320, which is provided on the insulating plate 302. The shaft 315 can be locked in its advanced position by the push lock mechanism. When the shaft 315 is locked, the gears 314 and 316 are no longer in mesh with each other, so that the rotation of the shaft 315 will be lost and will not be transmitted.

Numeral 321 designates optical fibers each of which has one end secured to the projection of the associated arm 313 extending on the outer side of the casing 301, is led through the associated slot 304 formed in the casing 301 and a notch (not shown) formed in the insulating plate and has the other end held in the neiborhood of a light source 322. The light source 322 is mounted via a holder 323 on a support 324, which is in turn secured by suitable means to the insulating plate 302. Each optical fiber 321 has a sufficient length to be able to follow the movement of the associated arm 313 and is arranged such that it will not interfere with the operation of the slide member 309 and drive shaft 312.

In operation, by turning any one of the shafts 315 its rotation is transmitted through the bevel gears 316 and 314 to the associated drive shaft 312 provided its stepped portion 319 is not coupled to the associated push lock mechanism 320, thus causing the rotation of the drive shaft 312 penetrating the associated slide member 309. Since the brush 310 secured to the slide member 309 is in mesh with the peripheral helical groove formed of the drive shaft 312, with the rotation of the shaft 315 the slide member 309 is moved along the drive shaft 312. With the movement of the slide member 309 the brush 310 also moves in frictional contact with the resistor 305 and contact means 306, so that it is possible to take out a variable resistance between either one of the end terminals 307 and the intermediate terminal 308.

Meanwhile, with the movement of the slide member 309 the free end of the associated optical fiber 321 is also moved in unison. Since the other end of the optical fiber 321 is held in the neiborhood of the light source 322, with the light source 322 in the "on" state the movement of the free end of the optical fiber 321 can be observed as the movement of a bright spot.

Here, it may be worthwhile to provide the front wall of the casing with graduations for reading the individual bright spots of the optical fibers 321.

While in the instant embodiment the metal casing 301 is formed with the slots 303 and 304, it is possible to replace each pair of slots 303 and 304 with a single slot.

We claim:

1. A combined variable resistor assembly provided with position indicator means, comprising a panel formed with a plurality of parallel elongate openings, slidable variable resistors corresponding in number to the number of said elongate openings and mounted on said panel on the back side thereof, each said variable resistor including a slide member having a slide lever penetrating the associated one of said openings, each said slide lever having an arm protruding on the front side of said panel, operable shafts corresponding in number to the number of said variable resistors and each rotatably mounted in said panel at a position thereof spaced from the slidable span of the associated slide lever, first pulleys secured to said respective operable shafts, second pulleys paired with said respective first pulleys and rotatably mounted on the front side of said panel at respective positions spaced from the slidable span of the respective associated slide levers, rope means each passed round each pair of said first and second pulleys and connected to each said slide lever, a light source, and optical fibers each having one end held in the neiborhood of said light source and the other end connected to each said slide lever.

2. A combined variable resistor assembly provided with position indicator means according to claim 1, wherein each said rope means comprises a rope and a tension spring forming a loop together with said rope.

3. A combined variable resistor assembly provided with position indicator means according to claim 1, which further comprises click detent mechanisms provided for said respective operable shafts, each said click detent mechanism comprising a resilient member serving as a spring arm, said resilient member being joined to the associated first pulley and having at the free end a ball or round head, and a stationary click plate formed with one or more click holes, said ball or round head being adapted to be clicked into said click hole or holes.

4. A combined variable resistor assembly provided with position indicator means according to claim 1, which further comprises a switch mounted on said panel through a shaft aligned to said operable shafts.

* * * * *